(12) United States Patent
Oba (10) Patent No.: US 7,655,541 B2
(45) Date of Patent: Feb. 2, 2010

(54) WAFER PROCESSING METHOD AND LASER PROCESSING APPARATUS

(75) Inventor: Ryugo Oba, Tokyo (JP)

(73) Assignee: Disco Corporation, Tokyo (JP)

( * ) Notice: Subject to any disclaimer, the term of this patent is extended or adjusted under 35 U.S.C. 154(b) by 183 days.

(21) Appl. No.: 12/068,459

(22) Filed: Feb. 6, 2008

(65) Prior Publication Data

US 2008/0200012 A1 Aug. 21, 2008

(30) Foreign Application Priority Data

Feb. 19, 2007 (JP) ............................. 2007-037476

(51) Int. Cl.
H01L 21/78 (2006.01)
H01L 21/30 (2006.01)
H01L 21/46 (2006.01)
H01L 21/50 (2006.01)
H01L 21/48 (2006.01)
H01L 21/44 (2006.01)
H01L 21/768 (2006.01)
H01L 23/544 (2006.01)

(52) U.S. Cl. ..................... 438/463; 438/113; 438/110; 438/458; 438/460; 438/462; 438/464; 257/620; 257/E21.596; 257/E21.599

(58) Field of Classification Search ................. 438/110, 438/113, 458, 460, 462, 463, 464; 257/620, 257/E21.596, E21.599
See application file for complete search history.

(56) References Cited

U.S. PATENT DOCUMENTS 6,130,401 A 10/2000 Yoo et al.
6,580,054 B1 * 6/2003 Liu et al. ............... 219/121.68
6,770,842 B2 * 8/2004 Nam et al. ............. 219/121.72
7,304,265 B2 * 12/2007 Otsu et al. ............. 219/121.62
7,396,780 B2 * 7/2008 Hoshino et al. ............. 438/795

FOREIGN PATENT DOCUMENTS

JP 2000-156358 6/2000

* cited by examiner

Primary Examiner—Luan C Thai
(74) Attorney, Agent, or Firm—Smith, Gambrell & Russell, LLP (57) ABSTRACT

In a wafer processing method for penetrating a wafer by use of a laser processing apparatus including a chuck table for holding the wafer, laser beam irradiation means for irradiating the wafer held on the chuck table with a laser beam, and imaging means for imaging the wafer held on the chuck table, the chuck table includes a chuck table main body, a holding member disposed on an upper surface of the chuck table main body and having a holding surface for holding an entire surface of the wafer, the holding member comprising a transparent or translucent member, and a light emitting body disposed laterally of a side of the holding member opposite to the holding surface. The wafer processing method comprises irradiating a predetermined processing region of the wafer held on the chuck table with the laser beam to perform the penetration in a predetermined manner, then lighting the light emitting body, with the wafer being held on the chuck table, imaging the processing region by the imaging means, and determining acceptance or rejection of the penetration based on whether or not light has passed through the processing region.

6 Claims, 5 Drawing Sheets

WAFER PROCESSING METHOD AND LASER PROCESSING APPARATUS

FIELD OF THE INVENTION

This invention relates to a wafer processing method and a laser processing apparatus which are suitable for cutting a wafer along a street, the wafer having a plurality of the streets formed in a lattice pattern on the surface thereof, and also having devices formed in a plurality of regions defined by the plurality of streets.

DESCRIPTION OF THE PRIOR ART

In a semiconductor device manufacturing process, a plurality of regions are defined by lines, called streets, which are arranged in a lattice pattern on the surface of a nearly disk-shaped semiconductor wafer, and along which division is scheduled to be carried out (the lines will be referred to hereinafter as the division-scheduled lines). Devices, such as IC's and LSI's, are formed in these defined regions. The semiconductor wafer is cut along the streets, whereby the regions having the devices formed therein are divided to produce individual semiconductor chips. An optical device wafer having a gallium nitride-based compound semiconductor or the like laminated on the surface of a sapphire substrate is also cut along streets, and divided thereby into individual optical devices such as light emitting diodes and laser diodes. These devices are widely used for electrical equipment.

The above-mentioned cutting, along the division-scheduled lines, of the semiconductor wafer or the optical device wafer is performed usually by a cutting apparatus called a dicer. This cutting apparatus comprises a chuck table for holding a workpiece such as a semiconductor wafer or an optical device wafer, a cutting means for cutting the workpiece held on the chuck table, and a cutting feed means for moving the chuck table and the cutting means relative to each other. The cutting means includes a spindle unit equipped with a rotating spindle, a cutting blade mounted on the rotating spindle, and a drive mechanism for rotationally driving the rotating spindle. The cutting means cuts the wafer in such a manner that the depth of cut by the rotating cutting blade is adjusted.

A method for dividing the semiconductor wafer or the optical device wafer along the streets, as mentioned above, is disclosed in JP-A-2000-156358, which describes a method comprising irradiating the wafer with a pulsed laser beam of a wavelength absorbable to the wafer along the streets to form laser-processed grooves, and breaking the wafer along the laser-processed grooves.

Complete cutting of the wafer along the streets by the cutting apparatus can be easily achieved by adjusting the depth of cut by the cutting blade. In completely cutting the wafer along the streets by laser processing, on the other hand, a region where cutting is incomplete occurs, if there is a variation in the thickness of the wafer, or if a testing metal pattern, called a test element group (TEG), for testing the function of the device is disposed on the street. Even if the occurrence of the region of incomplete cutting is found after the processed wafer is carried out of the laser processing apparatus, it is difficult to reprocess the wafer. That is, the completely cut-off device slightly moves when the processed wafer is carried outward from the chuck table of the laser processing apparatus. Thus, when the wafer detached from the chuck table after processing is held again on the chuck table, the street in the region of complete cutting and the street in the region of incomplete cutting do not coincide, thereby making reprocessing difficult.

SUMMARY OF THE INVENTION

It is an object of the present invention to provide a wafer processing method and a laser processing apparatus which can confirm whether a wafer has been completely cut (penetrated) along streets while being held on a chuck table.

According to the present invention, as a method for attaining the above object, there is provided a wafer processing method for penetrating a wafer by use of a laser processing apparatus including a chuck table for holding the wafer, a laser beam irradiation means for irradiating the wafer held on the chuck table with a laser beam, and an imaging means for imaging the wafer held on the chuck table, the chuck table including a chuck table main body, a holding member disposed on an upper surface of the chuck table main body and having a holding surface for holding an entire surface of the wafer, the holding member comprising a transparent or translucent member, and a light emitting body disposed laterally of a side of the holding member opposite to the holding surface, the wafer processing method comprising irradiating a predetermined processing region of the wafer held on the chuck table with the laser beam to perform the penetration in a predetermined manner, then lighting the light emitting body, with the wafer being held on the chuck table, imaging the processing region by the imaging means, and determining acceptance or rejection of the penetration based on whether or not light has passed through the processing region.

It is preferred that if the processing region where the penetration is incomplete has been confirmed, the processing region where the penetration is incomplete is reprocessed, with the wafer being held on the chuck table.

Preferably, if the proportion of the processing regions where the penetration is incomplete exceeds a tolerance, processing conditions are considered and changed.

The penetration can be cutting of the wafer.

According to the present invention, there is also provided a laser processing apparatus including a chuck table for holding a wafer, a laser beam irradiation means for irradiating the wafer held on the chuck table with a laser beam, a processing feed means for processing-feeding the chuck table and the laser beam irradiation means relative to each other in a processing feed direction, an indexing feed means for indexing-feeding the chuck table and the laser beam irradiation means in an indexing feed direction orthogonal to the processing feed direction, a processing feed position detecting means for detecting the processing feed position of the chuck table, an indexing feed position detecting means for detecting the indexing feed position of the chuck table, an imaging means for imaging the wafer held on the chuck table, and a control means for determining the processed state of the wafer held on the chuck table based on an image signal produced by the imaging means and detection signals from the processing feed position detecting means and the indexing feed position detecting means, wherein the chuck table includes a chuck table main body, a holding member disposed on an upper surface of the chuck table main body and having a holding surface for holding an entire surface of the wafer, the holding member comprising a transparent or translucent member, and a light emitting body disposed laterally of a side of the holding member opposite to the holding surface, and the control means determines whether the wafer held on the chuck table and laser-processed has been completely cut, based on the image signal from the imaging means having imaged the processing position of the wafer, and obtains the coordinate values of a region where cutting is not complete, based on the detection signals from the processing feed position detecting means and the indexing feed position detecting means.

Preferably, a plurality of grooves reaching the outer periphery of the holding surface of the holding member are formed in the holding surface.

According to the present invention, the chuck table includes the chuck table main body, the holding member disposed on the upper surface of the chuck table main body and having the holding surface for holding the entire surface of the wafer, the holding member comprising the transparent or translucent member, and the light emitting body disposed laterally of the side of the holding member opposite to the holding surface. Thus, it can be confirmed whether the wafer held on the chuck table and laser-processed has been completely cut (penetrated). This makes it possible to confirm whether the wafer has been completely cut, without detaching the wafer from the chuck table after processing the wafer, and also to reprocess the confirmed region of incomplete cutting. Since the individually divided devices do not move, the region of incomplete cutting can be reprocessed accurately. If the proportion of the regions of incomplete cutting is very high, this is used as data for considering and changing the processing conditions.

DETAILED DESCRIPTION OF THE PREFERRED EMBODIMENTS

Preferred embodiments of the wafer processing method and laser processing apparatus according to the present invention will be described in detail by reference to the accompanying drawings.

Figure 1:
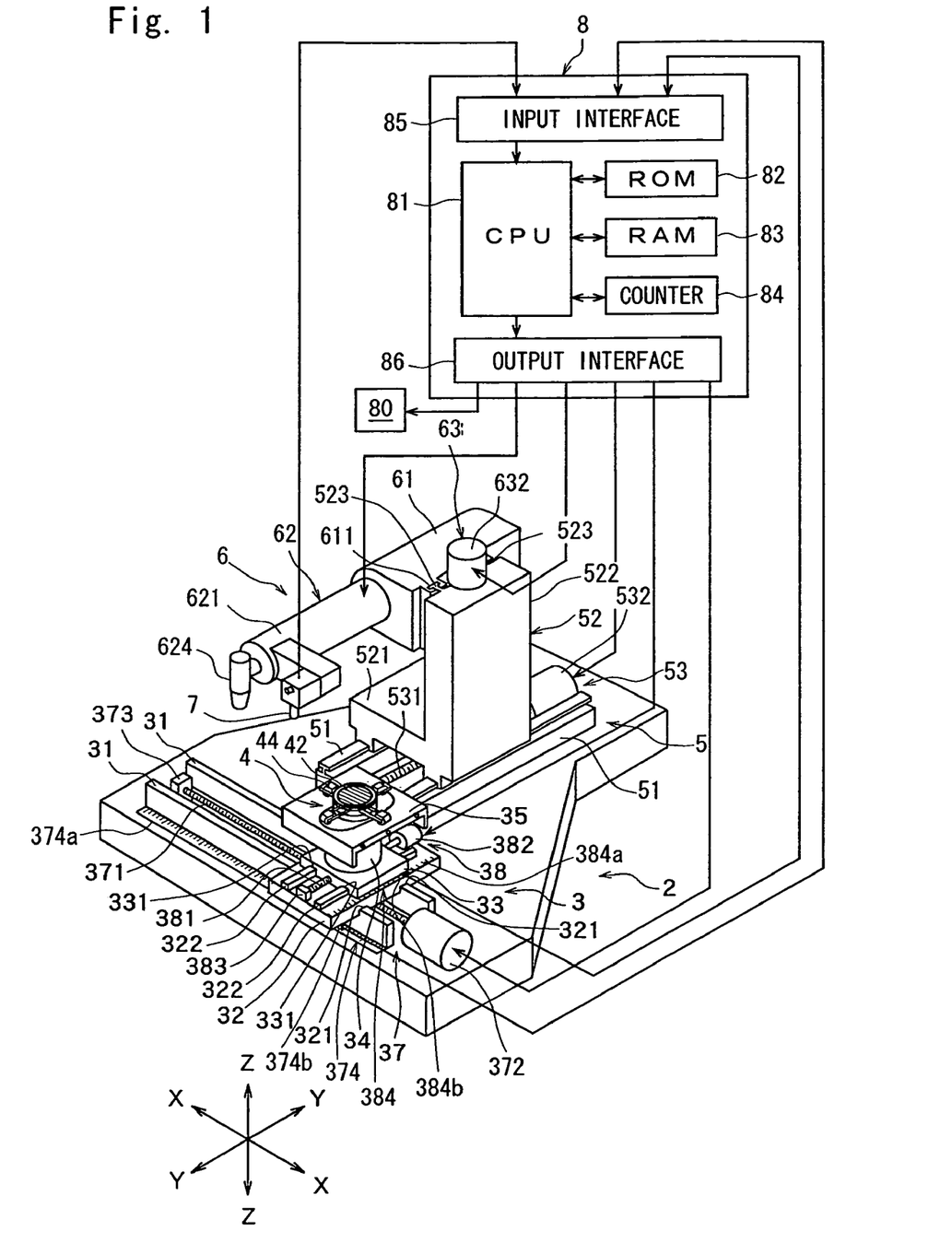
FIG. 1 is a perspective view of a laser processing apparatus constituted in accordance with the present invention.

FIG. 1 shows a perspective view of a laser processing apparatus constituted in accordance with the present invention. The laser processing apparatus shown in FIG. 1 is furnished with a stationary platform 2, a chuck table mechanism 3 disposed on the stationary platform 2 so as to be movable in a processing feed direction indicated by a double-headed arrow X and adapted to hold a workpiece, a laser beam irradiation unit support mechanism 5 disposed on the stationary platform 2 so as to be movable in an indexing feed direction indicated by a double-headed arrow Y perpendicular to the above direction indicated by the double-headed arrow X, and a laser beam irradiation unit 6 disposed on the laser beam irradiation unit support mechanism 5 so as to be movable in a direction indicated by a double-headed arrow Z.

The chuck table mechanism 3 is furnished with a pair of guide rails 31, 31 disposed in parallel on the stationary platform 2 along the processing feed direction indicated by the double-headed arrow X, a first slide block 32 disposed on the guide rails 31, 31 so as to be movable in the processing feed direction indicated by the double-headed arrow X, a second slide block 33 disposed on the first slide block 32 so as to be movable in the indexing feed direction indicated by the double-headed arrow Y, a cover table 35 supported above the second slide block 33 by a cylindrical supporting tubular body 34, and a chuck table 4 as a workpiece holding means.

The chuck table 4 will be explained by reference to FIG. 2.

Figure 2:
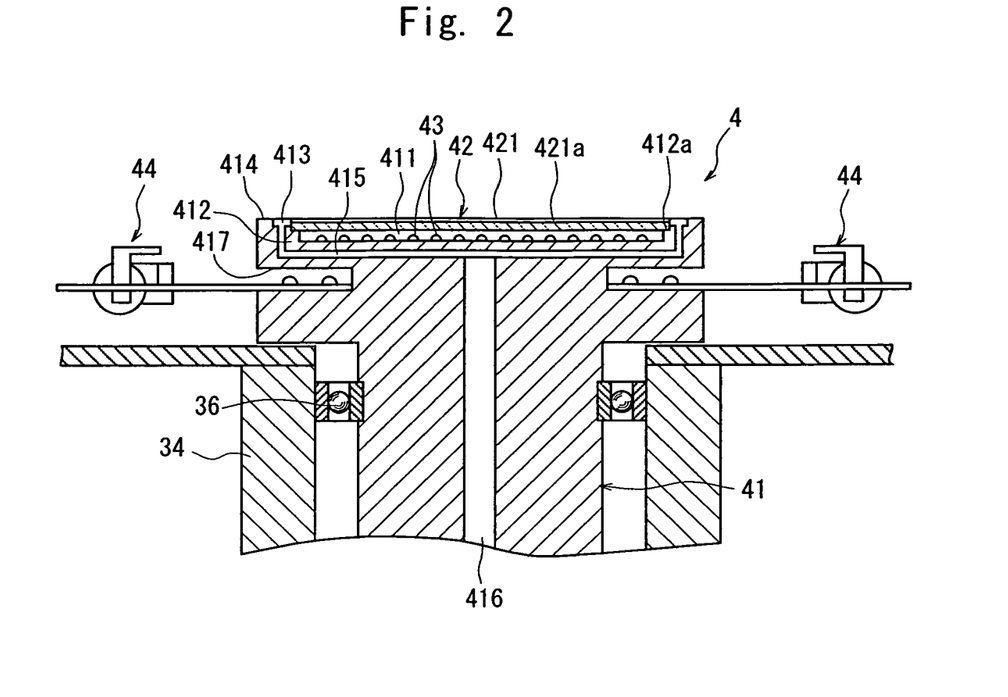
FIG. 2 is a sectional view of a chuck table installed in the laser processing apparatus shown in FIG. 1.

The chuck table 4 shown in FIG. 2 is supported rotatably via a bearing 36 by the cylindrical supporting tubular body 34 disposed on the upper surface of the second slide block 33. The chuck table 4 is furnished with a columnar chuck table main body 41, a holding member 42 disposed on the upper surface of the chuck table main body 41 for holding the entire surface of a wafer, the holding member 42 comprising a transparent or translucent member, and a light emitting body 43 disposed below the holding member 42 in FIG. 2. The chuck table main body 41 has a circular fitting concave portion 411 provided in its upper surface, an annular holding member support portion 412 provided to surround the fitting concave portion 411, an annular suction groove 413 formed to surround the holding member support portion 412, an annular seal portion 414 provided to surround the annular suction groove 413, a communicating passage 415 communicating with the annular suction groove 413, and a suction passageway 416 communicating with the communicating passage 415. An annular placing shelf 412a, on which the holding member 42 is placed, is provided in an inner peripheral part of the annular holding member support portion 412. The suction passageway 416 is in communication with a suction means (not shown). Thus, when the suction means (not shown) is actuated, a negative pressure is applied to the annular suction groove 413 through the suction passageway 416 and the communicating passage 415. The main body 41 thus configured is rotated by a pulse motor (not shown) disposed within the cylindrical supporting tubular body 34.

The holding member 42 placed on the annular placing shelf 412a provided in the annular holding member support portion 412 comprises a quartz plate having a thickness of 2 to 5 mm, and its upper surface functions as a holding surface 421 for holding the entire surface of the wafer to be described later. In the holding surface 421, a plurality of grooves 421a reaching the outer periphery of the holding surface 421 are formed throughout the whole of the holding surface 421. The plurality of grooves 421a are set to have a width of 0.03 to 0.1 mm, a depth of 0.05 to 0.1 mm, and a groove-to-groove spacing of 0.1 to 5 mm. The shape of each of the grooves 421a may be a V-shape or a U-shape. Such grooves can be formed with the use of a cutting apparatus for cutting a semiconductor wafer or the like along streets, with the amount of radial feed of a cutting blade being set at a predetermined value.

The light emitting body 43 comprises an LED or the like, and a plurality of the light emitting bodies 43 are disposed on the bottom surface of the circular fitting concave portion 411, and connected to a power circuit (not shown). Thus, the plurality of light emitting bodies 43 are disposed laterally of a side of the holding member 42 opposite to the holding surface 421, and throw light from the lower surface side of the holding member 42.

An annular groove 417 is formed in the outer periphery of an upper part of the chuck table main body 41. Bases of four clamps 44 (see FIG. 1) are disposed within the annular groove 417, and these bases of the clamps 44 are attached to the chuck table main body 41 by suitable fixing means. The cover table 35 is placed at the upper end of the cylindrical supporting tubular body 34 so as to be relatively movable.

Returning to FIG. 1 for explanation, the first slide block 32 has a lower surface provided with a pair of guided grooves 321, 321 fitted to the pair of guide rails 31, 31, and has an upper surface provided with a pair of guide rails 322, 322 formed in parallel along the indexing feed direction indicated by the double-headed arrow Y. The so constituted first slide block 32 has the guided grooves 321, 321 fitted to the pair of guide rails 31, 31, whereby the first slide block 32 can be moved in the processing feed direction, indicated by the double-headed arrow X, along the pair of guide rails 31, 31. The chuck table mechanism 3 in the illustrated embodiment is equipped with a processing feed means 37 for moving the first slide block 32 in the processing feed direction, indicated by the double-headed arrow X, along the pair of guide rails 31, 31. The processing feed means 37 includes an externally threaded rod 371 disposed between and parallel to the guide rails 31 and 31 paired, and a drive source, such as a pulse motor 372, for rotationally driving the externally threaded rod 371. The externally threaded rod 371 has one end rotatably supported by a bearing block 373 fixed to the stationary platform 2, and has the other end drivingly coupled to an output shaft of the pulse motor 372. The externally threaded rod 371 is screwed to an internally threaded through-hole formed in an internally threaded block (not shown) provided protrusively on the lower surface of a central part of the first slide block 32. Thus, the externally threaded rod 371 is driven to rotate in forward and reverse directions by the pulse motor 372, whereby the first slide block 32 is moved along the guide rails 31, 31 in the processing feed direction indicated by the double-headed arrow X.

The laser processing apparatus in the illustrated embodiment is equipped with a processing feed position detecting means 374 for detecting the amount of processing feed of the chuck table 4. The processing feed position detecting means 374 is composed of a linear scale 374*a* disposed along the guide rail 31, and a read head 374*b* disposed in the first slide block 32 and moving along the linear scale 374*a* together with the first slide block 32. In the illustrated embodiment, the read head 374*b* of the processing feed position detecting means 374 sends pulse signals to a control means (to be described later) at a rate of one pulse at intervals of 1 μm. The control means to be described later detects the processing feed position of the chuck table 4 by counting the pulse signals inputted. When the pulse motor 372 is used as the drive source for the processing feed means 37, the processing feed position of the chuck table 4 can be detected by counting drive pulses of the control means (to be described later) which outputs drive signals to the pulse motor 372. When a servo motor is used as the drive source for the processing feed means 37, the processing feed position of the chuck table 4 can be detected by transmitting to the control means (to be described later) pulse signals outputted by a rotary encoder detecting the rotational speed of the servo motor, and counting the pulse signals inputted into the control means.

The second slide block 33 has a lower surface provided with a pair of guided grooves 331, 331 fitted to the pair of guide rails 322, 322 provided on the upper surface of the first slide block 32. The guided grooves 331, 331 are fitted to the pair of guide rails 322, 322, whereby the second slide block 33 can be moved in the indexing feed direction indicated by the double-headed arrow Y. The chuck table mechanism 3 in the illustrated embodiment is equipped with a first indexing feed means 38 for moving the second slide block 33 in the indexing feed direction, indicated by the double-headed arrow Y, along the pair of guide rails 322, 322 provided on the first slide block 32. The first indexing feed means 38 includes an externally threaded rod 381 disposed between and parallel to the guide rails 322 and 322 paired, and a drive source, such as a pulse motor 382, for rotationally driving the externally threaded rod 381. The externally threaded rod 381 has one end rotatably supported by a bearing block 383 fixed to the upper surface of the first slide block 32, and has the other end drivingly coupled to an output shaft of the pulse motor 382. The externally threaded rod 381 is screwed to an internally threaded through-hole formed in an internally threaded block (not shown) provided protrusively on the lower surface of a central part of the second slide block 33. Thus, the externally threaded rod 381 is driven by the pulse motor 382 to rotate in forward and reverse directions, whereby the second slide block 33 is moved along the guide rails 322, 322 in the indexing feed direction indicated by the double-headed arrow Y.

The laser processing apparatus in the illustrated embodiment is equipped with an indexing feed position detecting means 384 for detecting the amount of indexing feed of the second slide block 33. The indexing feed position detecting means 384 is composed of a linear scale 384*a* disposed along the guide rail 322, and a read head 384*b* disposed in the second slide block 33 and moving along the linear scale 384*a* together with the second slide block 33. In the illustrated embodiment, the read head 384*b* of the indexing feed position detecting means 384 sends pulse signals to the control means (to be described later) at a rate of one pulse at intervals of 1 μm. The control means to be described later detects the indexing feed position of the chuck table 4 by counting the pulse signals inputted. When the pulse motor 382 is used as the drive source for the first indexing feed means 38, the indexing feed position of the chuck table 4 can be detected by counting drive pulses of the control means (to be described later) which outputs drive signals to the pulse motor 382. When a servo motor is used as the drive source for the first indexing feed means 38, the indexing feed position of the chuck table 4 can be detected by transmitting to the control means (to be described later) pulse signals outputted by a rotary encoder detecting the rotational speed of the servo motor, and counting the pulse signals inputted into the control means.

The laser beam irradiation unit support mechanism 5 is furnished with a pair of guide rails 51, 51 disposed in parallel on the stationary platform 2 along the indexing feed direction indicated by the double-headed arrow Y, and a movable support stand 52 disposed on the guide rails 51, 51 so as to be movable in the direction indicated by the double-headed arrow Y. The movable support stand 52 is composed of a moving support portion 521 disposed movably on the guide rails 51, 51, and a mounting portion 522 attached to the moving support portion 521. The mounting portion 522 has a pair of guide rails 523, 523 provided in parallel on one side surface thereof and extending in the direction indicated by the double-headed arrow Z. The laser beam irradiation unit support mechanism 5 in the illustrated embodiment is equipped with a second indexing feed means 53 for moving the movable support stand 52 in the indexing feed direction, indicated by the double-headed arrow Y, along the pair of guide rails 51, 51. The second indexing feed means 53 includes an externally threaded rod 531 disposed between and parallel to the guide rails 51 and 51 paired, and a drive source, such as a pulse motor 532, for rotationally driving the externally threaded rod 531. The externally threaded rod 531 has one end rotatably supported by a bearing block (not shown) fixed to the stationary platform 2, and has the other end drivingly coupled to an output shaft of the pulse motor 532. The externally threaded rod 531 is screwed to an internally threaded hole formed in an internally threaded block (not shown) provided protrusively on the lower surface of a central part of the moving support portion 521 constituting the movable support stand 52. Thus, the externally threaded rod 531 is driven by the pulse motor 532 to rotate in forward and reverse directions, whereby the movable support stand 52 is moved along the guide rails 51, 51 in the indexing feed direction indicated by the double-headed arrow Y.

The laser beam irradiation unit 6 in the illustrated embodiment is equipped with a unit holder 61, and a laser beam irradiation means 62 attached to the unit holder 61. The unit holder 61 is provided with a pair of guided grooves 611, 611 slidably fitted to the pair of guide rails 523, 523 provided in the mounting portion 522. The guided grooves 611, 611 are fitted to the guide rails 523, 523, whereby the unit holder 61 is supported to be movable in the direction indicated by the double-headed arrow Z.

The laser beam irradiation unit 6 in the illustrated embodiment is equipped with a moving means 63 for moving the unit holder 61 in the direction indicated by the double-headed arrow Z (Z-axis direction) along the pair of guide rails 523, 523. The moving means 63 includes an externally threaded rod (not shown) disposed between the guide rails 523 and 523 paired, and a drive source, such as a pulse motor 632, for rotationally driving the externally threaded rod. The externally threaded rod (not shown) is driven by the pulse motor 632 to rotate in forward and reverse directions, whereby the unit holder 61 and the laser beam irradiation means 62 are moved along the guide rails 523, 523 in the direction indicated by the double-headed arrow Z (Z-axis direction). In the illustrated embodiment, the pulse motor 632 is driven in a forwardly rotating direction to move the laser beam irradiation means 62 upward, and the pulse motor 632 is driven in a reversely rotating direction to move the laser beam irradiation means 62 downward.

Figure 3:
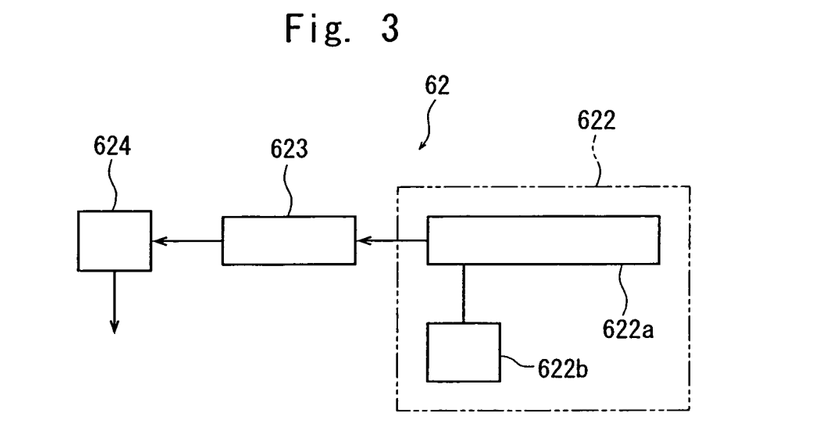
FIG. 3 is a block diagram schematically showing the configuration of a laser beam irradiation means installed in the laser processing apparatus shown in FIG. 1.

The illustrated laser beam irradiation means 62 includes a cylindrical casing 621 placed substantially horizontally. Also, the laser beam irradiation means 62, as shown in FIG. 3, is equipped with a pulsed laser beam oscillation means 622 and a transmission optical system 623 disposed within the casing 621, and an optical focusing instrument 624 disposed at the leading end of the casing 621 for irradiating the workpiece, held on the chuck table 4, with a pulsed laser beam oscillated by the pulsed laser beam oscillation means 622. The pulsed laser beam oscillation means 622 is composed of a pulsed laser beam oscillator 622a comprising an YAG laser oscillator or an YVO4 laser oscillator, and a repetition frequency setting means 622b annexed to the pulsed laser beam oscillator 622a. The repetition frequency setting means 622b is controlled by the control means (to be described later). The transmission optical system 623 includes a suitable optical element such as a beam splitter.

Returning to FIG. 1 for explanation, an imaging means 7, which images a processing region to be laser-processed by the laser beam irradiation means 62, and the laser-processed region, is disposed at a leading end part of the casing 621 constituting the laser beam irradiation means 62. The imaging means 7 is composed of an imaging device (CCD) or the like, and sends an image signal, produced thereby, to a control means 8.

The control means 8 is composed of a computer, and is equipped with a central processing unit (CPU) 81 for performing computational processing according to a control program, a read-only memory (ROM) 82 storing the control program, etc., a random access memory (RAM) 83 which stores data on the design values of the workpiece (to be described later) and the results of computation, etc., and in which data can be written and read, a counter 84, an input interface 85, and an output interface 86. Detection signals from the processing feed position detecting means 374, the indexing feed position detecting means 384, and the imaging means 7 are inputted into the input interface 85 of the control means 8. Control signals are outputted from the output interface 86 of the control means 8 to the pulse motor 372, the pulse motor 382, the pulse motor 532, the pulse motor 632, the laser beam irradiation means 62, and a display means 80.

Figure 4:
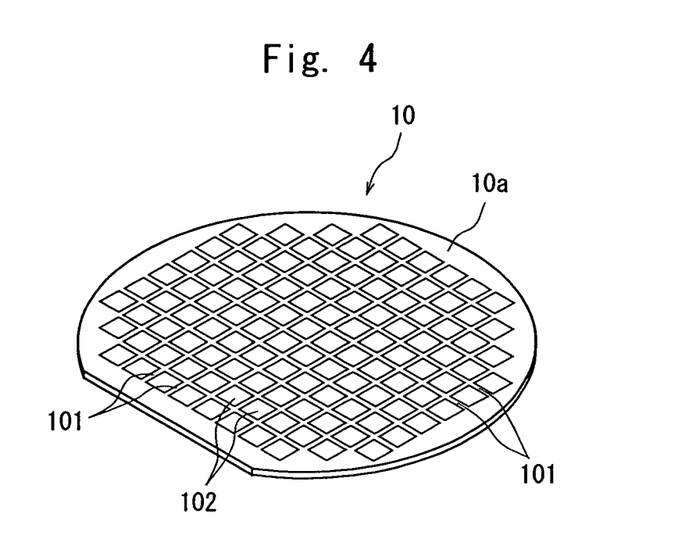
FIG. 4 is a perspective view showing a semiconductor wafer as a workpiece.

Next, the wafer to be processed by the above-described laser processing apparatus will be described with reference to FIG. 4. A semiconductor wafer 10 shown in FIG. 4 comprises a silicon wafer having a thickness of, for example, 30 μm. A plurality of streets 101 are formed in a lattice pattern on the face 10a of the semiconductor wafer 10, and devices 102 are formed in a plurality of regions defined by the plurality of streets 101.

Figure 5:
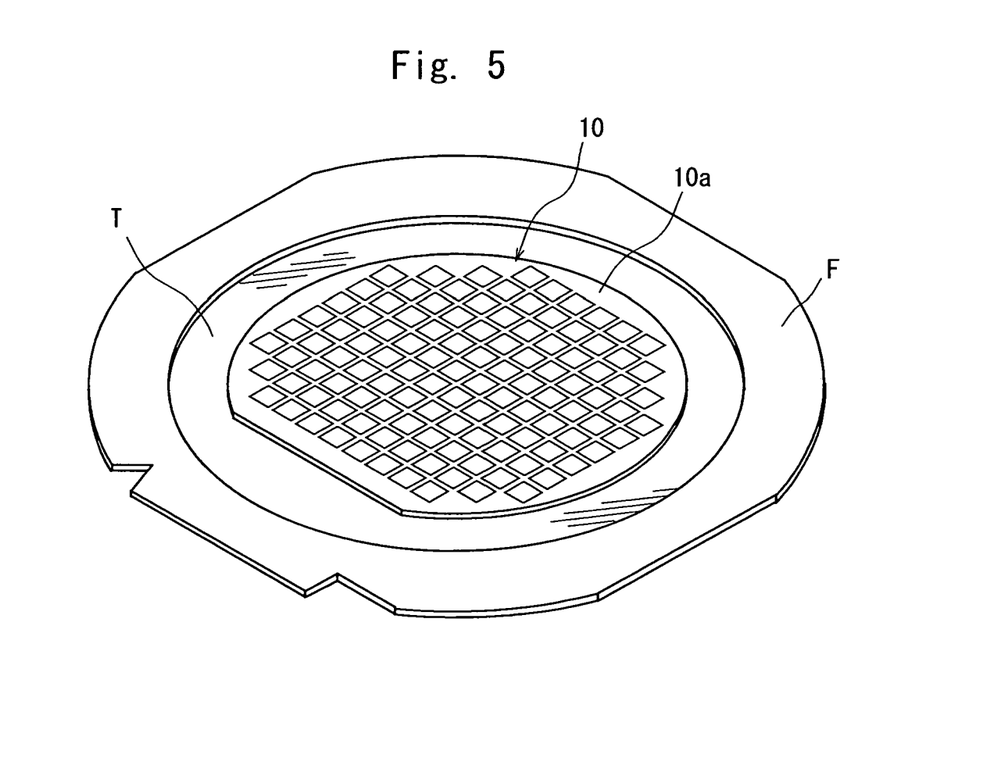
FIG. 5 is a perspective view showing a state in which the semiconductor wafer shown in FIG. 4 is supported on an annular frame via a dicing tape.

To process the above-mentioned semiconductor wafer 10 by the aforementioned laser processing apparatus, the semiconductor wafer 10 is stuck to a dicing tape T mounted on an annular frame F, as shown in FIG. 5. On this occasion, the semiconductor wafer 10 has the face 10a pointed upward, and has its back stuck to the dicing tape T. The dicing tape T comprises a translucent resin sheet such as a sheet of polyvinyl chloride (PVC).

Next, an explanation will be offered for a laser beam irradiation step of forming laser-processed grooves along the streets 101 of the above semiconductor wafer 10.

Figure 6:
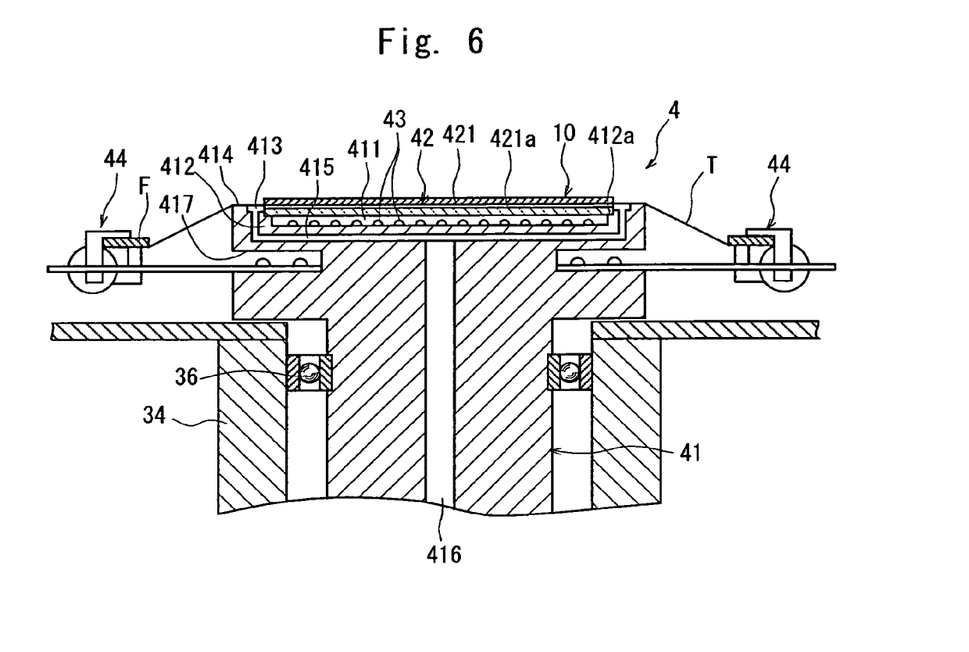
FIG. 6 is a sectional view showing a state in which the semiconductor wafer supported on the annular frame via the dicing tape is held on the chuck table of the laser processing apparatus.

The semiconductor wafer 10 supported on the annular frame F via the dicing tape T, as shown in FIG. 5, is mounted such that its side stuck to the dicing tape T is placed on the chuck table 4 of the laser processing apparatus, as shown in FIG. 6. Then, the annular frame F is fixed by the clamps 44. In this state, an outer peripheral part of the dicing tape T makes contact with the annular seal portion 414 of the chuck table main body 41. Then, the suction means (not shown) is actuated, whereupon a negative pressure is exerted on the annular suction groove 413 through the suction passageway 416 and the communicating passage 415. As a result, the negative pressure acts on the lower surface of the dicing tape T, so that a region of the dicing tape T to which the semiconductor wafer 10 is stuck is attracted to and held by the holding surface 421 of the holding member 42. In the holding surface 421 of the holding member 42, the plurality of grooves 421a reaching the outer periphery of the holding surface 421 are formed throughout the whole of the holding surface 421. Since the negative pressure acts on the plurality of grooves 421a the region of the dicing tape T where the semiconductor wafer 10 is stuck can be reliably attracted to and held by the holding surface 421.

The chuck table 4, which has sucked (attracted) and held the semiconductor wafer 10 as described above, is positioned directly below the imaging means 7 by the actuation of the processing feed means 37. When the chuck table 4 is positioned directly below the imaging means 7, an alignment operation for detecting the processing region of the semiconductor wafer 10 to be laser-processed is carried out by the imaging means 7 and the control means 8. That is, the imaging means 7 and the control means 8 perform image processing, such as pattern matching, for registering the street 101 formed in a predetermined direction of the semiconductor wafer 10 with the optical focusing instrument 624 of the laser beam irradiation means 62, which throws a laser beam along the street 101, thereby performing the alignment of a laser beam irradiation position. Similarly, the alignment of the laser beam irradiation position is also performed for the street 101 extending perpendicularly to the street 101 formed in the predetermined direction of the semiconductor wafer 10.

Figure 7:
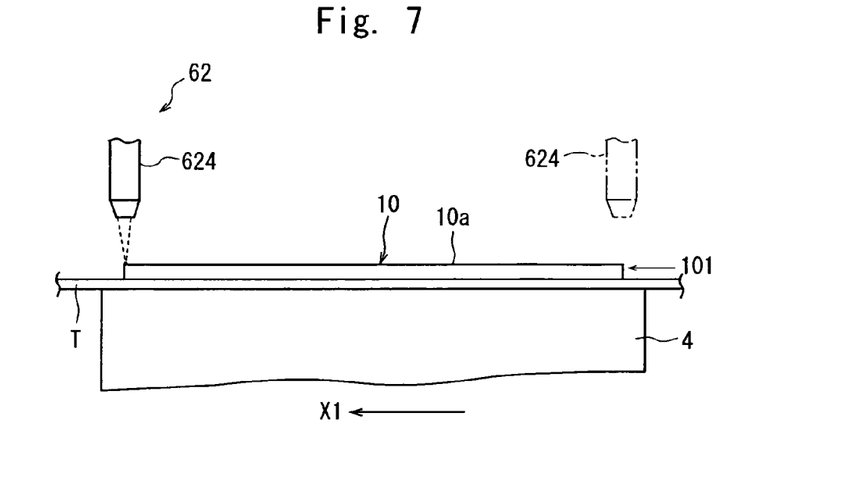
FIG. 7 is an explanation drawing of a laser beam irradiation step carried out by the laser processing apparatus shown in FIG. 1.

In the above manner, the street 101 formed in the semiconductor wafer 10 held on the chuck table 4 is detected, and the alignment of the laser beam irradiation position is performed. Upon this alignment, the chuck table 4 is moved to a laser beam irradiation region, where the optical focusing instrument 624 is located, and the predetermined street 101 is positioned directly below the optical focusing instrument 624, as shown in FIG. 7. At this time, the semiconductor wafer 10 is positioned such that one end of the street 101 (i.e., left end in FIG. 7) is located directly below the optical focusing instrument 624. Then, the laser beam irradiation means 62 is actuated, whereby the optical focusing instrument 624 irradiates the silicon wafer with a pulsed laser beam of a wavelength absorbable to the silicon wafer. Simultaneously, the chuck table 4 is moved at a predetermined processing feed speed in a direction indicated by an arrow X1 in FIG. 7 (laser beam irradiation step). When the other end of the street 101 (i.e., right end in FIG. 7) reaches the position directly below the optical focusing instrument 624, the irradiation with the pulsed laser beam is halted, and the movement of the chuck table 4 is stopped.

Figure 8:
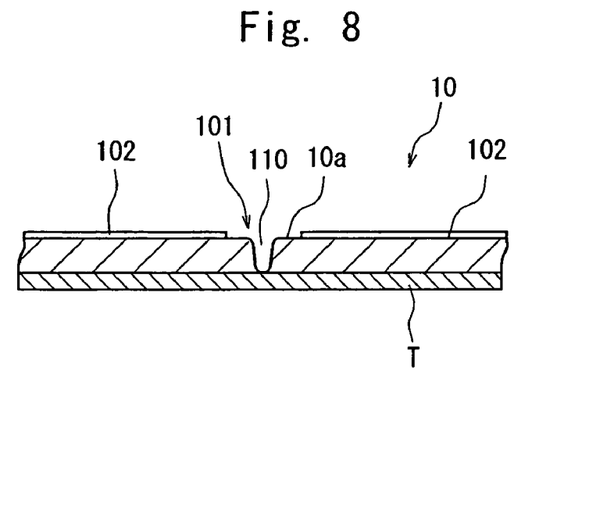
FIG. 8 is a partially enlarged sectional view of the semiconductor wafer for which the laser beam irradiation step shown in FIG. 7 was carried out.

The processing conditions in the above laser beam irradiation step are set as follows:

Light source: YVO4 laser or YAG laser
Wavelength: 355 nm
Repetition frequency: 20 kHz
Average output: 5 W
Diameter of focused light: 10 μm
Processing feed speed: 100 mm/second By performing the aforementioned laser beam irradiation step under the above-mentioned processing conditions, a laser-processed groove 110 penetrating from the face 10a to the back is formed along the street 101, as shown in FIG. 8, in the semiconductor wafer 10 comprising the silicon wafer of 30 μm in thickness. Thus, the semiconductor wafer 10 is completely cut (penetrated) along the street 101.

The above-described laser beam irradiation step is performed along all of the streets 101 formed in the predetermined direction in the semiconductor wafer 10, whereafter the chuck table 4 is turned through 90 degrees to turn the semiconductor wafer 10, held on the chuck table 4, through 90 degrees. Then, the above-described laser beam irradiation step is performed along all of the streets 101 formed in a direction orthogonal to the predetermined direction in the semiconductor wafer 10.

In the above-mentioned manner, the above laser beam irradiation step is performed along all the streets 101 of the semiconductor wafer 10. By so doing, the semiconductor wafer 10 is completely cut along all the streets 101, and thereby divided into the individual devices 102. However, if there is a variation in the thickness of the wafer, or if a testing metal pattern, called a test element group (TEG), is disposed on the street, a region where complete cutting has been impossible may occur. Hence, a cutting status confirmation step is performed to confirm whether the semiconductor wafer 10 has been completely cut along all the streets 101.

Figure 9:
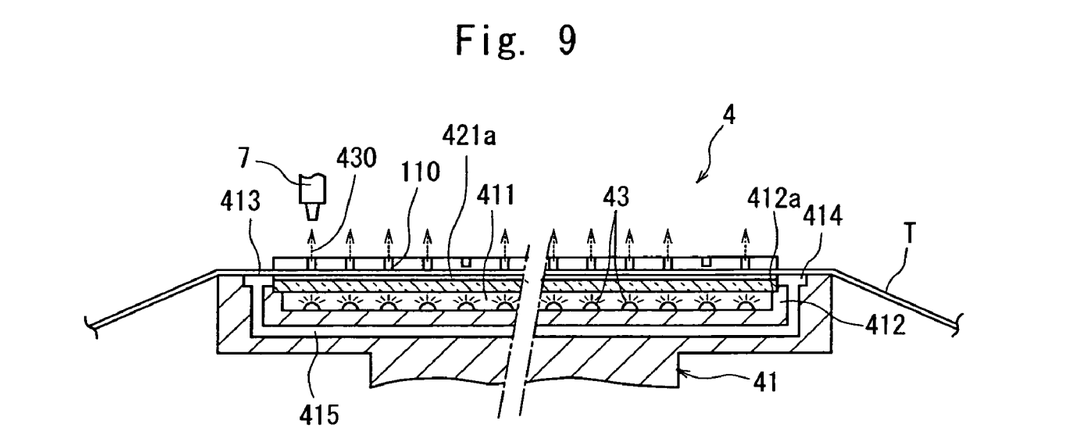
FIG. 9 is an explanation drawing of a cutting status confirmation step carried out by the laser processing apparatus shown in FIG. 1.

In the cutting status confirmation step, the chuck table 4 is moved and positioned directly below the imaging means 7, with the above-mentioned laser beam irradiation step having been performed, and the light emitting body 43 is lit as shown in FIG. 9. The light emitting body 43 is located directly below the predetermined street of the semiconductor wafer 10 where the laser-processed groove 110 has been formed. The imaging means 7 is actuated to image the laser-processed groove 110 formed in the street, while the chuck table 4 is moved in a direction perpendicular to the sheet plane of FIG. 9 along the laser-processed groove 110 formed in the street (laser-processed groove scanning step). During this period, an image obtained by the imaging means 7 is sent to the control means 8. At the same time, the detection signals from the processing feed position detecting means 374 and the indexing feed position detecting means 384 are sent to the control means 8. In this manner, the laser-processed groove scanning step is performed along all the streets 101 formed in the predetermined direction in the semiconductor wafer 10. Then, the chuck table 4 is turned through 90 degrees to turn the semiconductor wafer 10, held on the chuck table 4, through 90 degrees. Then, the above-described laser-processed groove scanning step is performed along all of the streets 101 formed in the direction orthogonal to the predetermined direction in the semiconductor wafer 10.

In the above-described laser-processed groove scanning step, if the laser-processed groove 110 penetrates (complete cutting), light thrown from the light emitting body 43 passes through the translucent dicing tape T and the holding member 42 comprising the transparent or translucent member, and passes through the laser-processed groove 110, as indicated by an arrow 430 in FIG. 9. Thus, the imaging means 7 receives a predetermined quantity of light. If the laser-processed groove 110 does not penetrate (incomplete cutting), on the other hand, light thrown from the light emitting body 43 does not pass through the laser-processed groove 110. Thus, the imaging means 7 cannot receive the predetermined quantity of light. In this manner, based on image information acquired by the imaging means 7, the control means 8 determines that the region, where the quantity of light has not reached the predetermined amount, is the region of incomplete cutting. The control means 8 finds the coordinate values of the region, which it has determined is the region of incomplete cutting, from the detection signals from the processing feed position detecting means 374 and the indexing feed position detecting means 384, and temporarily stores the coordinate values in the random access memory (RAM) 83.

In the above-mentioned manner, the cutting status confirmation step is performed to confirm the region of incomplete cutting. Then, the processing feed position detecting means 374 and the indexing feed position detecting means 384 are actuated to move the chuck table 4, thereby positioning the region of incomplete cutting in the semiconductor wafer 10 directly below the optical focusing instrument 624 of the laser beam irradiation means 62. Then, the region of incomplete cutting is irradiated with a pulsed laser beam from the optical focusing instrument 624 to carry out reprocessing (reprocessing step). This reprocessing may be performed only when the regions of incomplete cutting exceed a predetermined proportion. As described here, the use of the laser processing apparatus in the illustrated embodiment makes it possible to carry out the cutting status confirmation step and the reprocessing step, without detaching the semiconductor wafer 10 from the chuck table 4, after forming the laser-processed grooves 110 along the streets formed in the semiconductor wafer 10. Since the individually divided devices do not move in this case, the region of incomplete cutting can be accurately reprocessed. If the proportion of the regions of incomplete cutting is very high, on the other hand, this data is used for considering and changing the aforementioned processing conditions.

While the preferred embodiments of the present invention have been described in detail by reference to the accompanying drawings, it is to be understood that the invention is not limited to such embodiments, but various changes and modifications may be made without departing from the scope of the present invention.

What is claimed is:

1. A wafer processing method for penetrating a wafer by use of a laser processing apparatus including a chuck table for holding the wafer, laser beam irradiation means for irradiating the wafer held on the chuck table with a laser beam, and imaging means for imaging the wafer held on the chuck table,
the chuck table including a chuck table main body, a holding member disposed on an upper surface of the chuck table main body and having a holding surface for holding an entire surface of the wafer, the holding member comprising a transparent or translucent member, and a light emitting body disposed laterally of a side of the holding member opposite to the holding surface,
the wafer processing method comprising irradiating a predetermined processing region of the wafer held on the chuck table with the laser beam to perform the penetration in a predetermined manner, then lighting the light emitting body, with the wafer being held on the chuck table, imaging the processing region by the imaging means, and determining acceptance or rejection of the penetration based on whether or not light has passed through the processing region.

2. The wafer processing method according to claim 1, wherein if the processing region where the penetration is incomplete has been confirmed, the processing region where the penetration is incomplete is reprocessed, with the wafer being held on the chuck table.

3. The wafer processing method according to claim 1, wherein if a proportion of the processing regions where the penetration is incomplete exceeds a tolerance, processing conditions are considered and changed.

4. The wafer processing method according to claim 1, wherein the penetration is cutting of the wafer.

5. A laser processing apparatus including a chuck table for holding a wafer, laser beam irradiation means for irradiating the wafer held on the chuck table with a laser beam, processing feed means for processing-feeding the chuck table and the laser beam irradiation means relative to each other in a processing feed direction, indexing feed means for indexing-feeding the chuck table and the laser beam irradiation means in an indexing feed direction orthogonal to the processing feed direction, processing feed position detecting means for detecting a processing feed position of the chuck table, indexing feed position detecting means for detecting an indexing feed position of the chuck table, imaging means for imaging the wafer held on the chuck table, and control means for determining a processed state of the wafer held on the chuck table based on an image signal produced by the imaging means and detection signals from the processing feed position detecting means and the indexing feed position detecting means,
wherein the chuck table includes a chuck table main body, a holding member disposed on an upper surface of the chuck table main body and having a holding surface for holding an entire surface of the wafer, the holding member comprising a transparent or translucent member, and a light emitting body disposed laterally of a side of the holding member opposite to the holding surface, and
the control means determines whether the wafer held on the chuck table and laser-processed has been completely cut, based on the image signal from the imaging means having imaged a processing position of the wafer, and obtains coordinate values of a region where cutting is not complete, based on the detection signals from the processing feed position detecting means and the indexing feed position detecting means.

6. The laser processing apparatus according to claim 5, wherein a plurality of grooves reaching an outer periphery of the holding surface of the holding member are formed in the holding surface.

* * * * *